US012807841B2

(12) United States Patent
Hanano et al.

(10) Patent No.: US 12,807,841 B2
(45) Date of Patent: Nov. 24, 2026

(54) POLISHING AGENT, STOCK SOLUTION FOR POLISHING AGENT, AND POLISHING METHOD

(71) Applicant: Showa Denko Materials Co., Ltd., Tokyo (JP)

(72) Inventors: Masayuki Hanano, Tokyo (JP); Junpei Kawakita, Tokyo (JP); Kouji Haga, Tokyo (JP)

(73) Assignee: Resonac Corporation, Tokyo (JP)

(*) Notice: Subject to any disclaimer, the term of this patent is extended or adjusted under 35 U.S.C. 154(b) by 411 days.

(21) Appl. No.: 17/792,227

(22) PCT Filed: Jan. 16, 2020

(86) PCT No.: PCT/JP2020/001384
§ 371 (c)(1),
(2) Date: Jul. 12, 2022

(87) PCT Pub. No.: WO2021/144940
PCT Pub. Date: Jul. 22, 2021

(65) Prior Publication Data
US 2023/0094224 A1 Mar. 30, 2023

(51) Int. Cl.
*C09G 1/02* (2006.01)
*H10P 52/40* (2026.01)

(52) U.S. Cl.
CPC .............. *C09G 1/02* (2013.01); *H10P 52/402* (2026.01)

(58) Field of Classification Search
CPC ................ C09G 1/02; H01L 21/30625; H01L 21/31053; C09K 3/1436; C09K 3/14; H10P 52/402; H10P 95/062
See application file for complete search history.

(56) References Cited

U.S. PATENT DOCUMENTS

2002/0081949 A1* 6/2002 Yoshida ............... C09K 3/1463 257/E21.244
2005/0106874 A1* 5/2005 Matsui .............. H01L 21/31058 438/689
(Continued)

FOREIGN PATENT DOCUMENTS

JP 2009-206316 A 9/2009
JP 2010-129871 A 6/2010
(Continued)

OTHER PUBLICATIONS

Hanano et al. (JP 2017110219 A, Machine Translation). (Year: 2024).*

*Primary Examiner* — Binh X Tran
*Assistant Examiner* — Christopher Remavege
(74) *Attorney, Agent, or Firm* — Fitch, Even, Tabin & Flannery LLP

(57) ABSTRACT

An aspect of the present invention provides a polishing agent for polishing a base substrate having an organic silicon oxide and an insulating material containing silicon (excluding the organic silicon oxide) to remove at least a part of the organic silicon oxide, the polishing agent containing abrasive grains containing silica and an allylamine-based polymer, in which the abrasive grains have a positive charge in the polishing agent, the allylamine-based polymer is at least one selected from the group consisting of a tertiary allylamine-based polymer and a quaternary allylamine-based polymer, and a pH of the polishing agent is 2.8 to 5.0.

22 Claims, 1 Drawing Sheet

(56) References Cited

U.S. PATENT DOCUMENTS

| | | | | |
|---|---|---|---|---|
| 2006/0108326 | A1* | 5/2006 | Dysard | H01L 21/31053 438/692 |
| 2013/0244433 | A1* | 9/2013 | Reiss | C09G 1/02 438/693 |
| 2014/0024216 | A1* | 1/2014 | Stender | C09K 3/1436 438/692 |
| 2014/0154884 | A1* | 6/2014 | Kato | C09G 1/02 438/693 |
| 2015/0232704 | A1* | 8/2015 | Akutsu | H01L 21/76224 252/79.1 |
| 2016/0137881 | A1* | 5/2016 | Oota | C09K 3/1463 252/79.1 |
| 2017/0066102 | A1* | 3/2017 | Pandey | C09G 1/02 |
| 2017/0210958 | A1* | 7/2017 | Shinoda | C09K 3/1463 |
| 2018/0043497 | A1* | 2/2018 | Hanano | C09G 1/02 |
| 2018/0105428 | A1* | 4/2018 | Tawarazako | C01B 33/12 |
| 2018/0179417 | A1* | 6/2018 | Mizutani | C09K 3/14 |
| 2018/0258319 | A1* | 9/2018 | Akutsu | C09G 1/00 |
| 2018/0362805 | A1* | 12/2018 | Kozhukh | B24B 1/00 |
| 2019/0062593 | A1* | 2/2019 | Penta | C09G 1/02 |
| 2019/0092970 | A1* | 3/2019 | Guo | C09K 3/1436 |
| 2019/0092973 | A1* | 3/2019 | Penta | H01L 21/76224 |
| 2021/0047541 | A1* | 2/2021 | Tseng | H01L 21/31053 |

FOREIGN PATENT DOCUMENTS

| | | | | |
|---|---|---|---|---|
| JP | 4564735 | B2 | | 10/2010 |
| JP | 2011-023448 | A | | 2/2011 |
| JP | 2017110219 | A | * | 6/2017 |
| JP | 2017-139350 | A | | 8/2017 |
| JP | 2019-059921 | A | | 4/2019 |
| JP | 2019-163420 | A | | 9/2019 |
| WO | 2010/084535 | A1 | | 7/2010 |

* cited by examiner

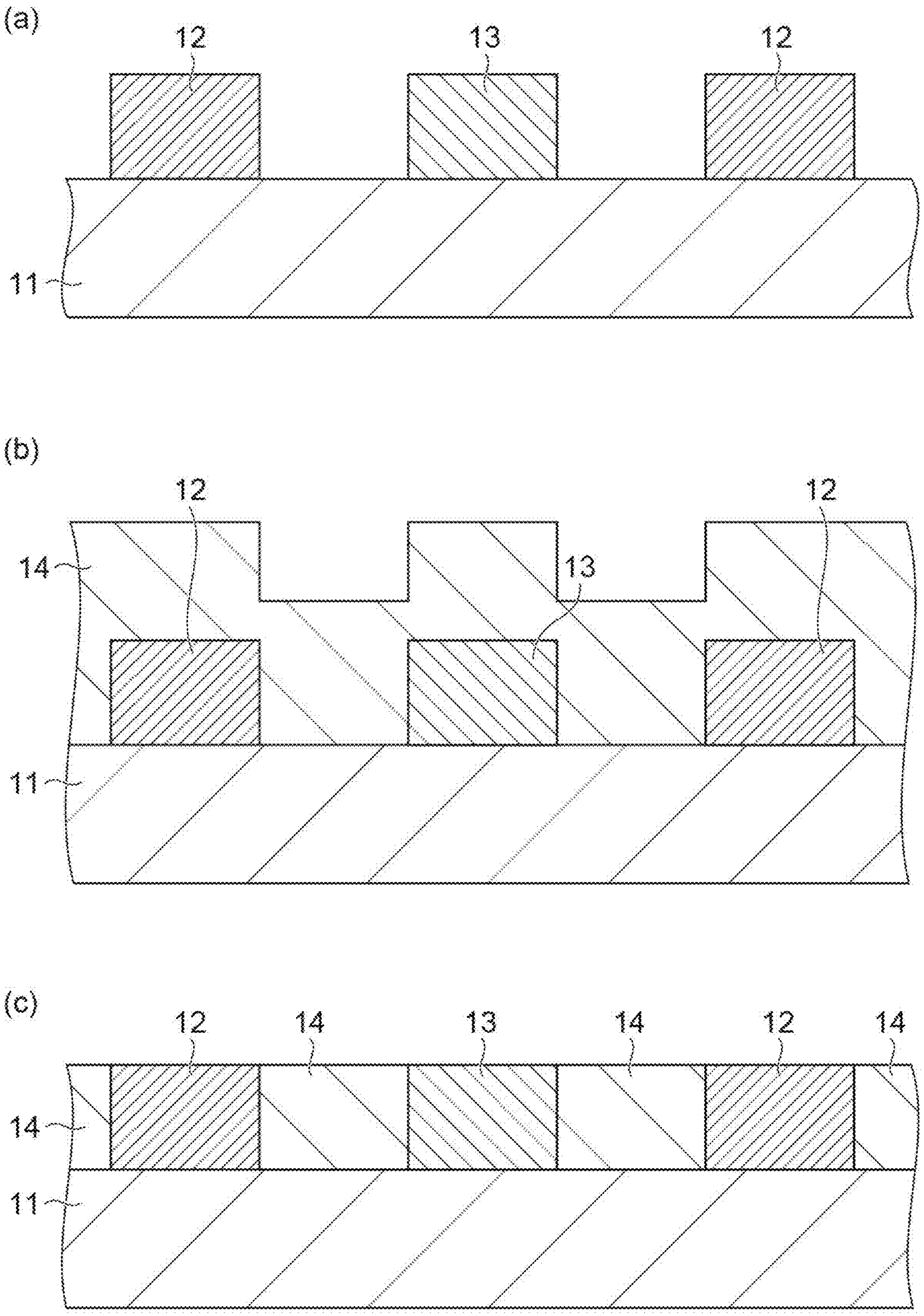
(a)
12
13
12
11
(b)
12
12
14
13
11
(c)
12
14
13
14
12
14
14
11

POLISHING AGENT, STOCK SOLUTION FOR POLISHING AGENT, AND POLISHING METHOD

CROSS-REFERENCE TO RELATED APPLICATIONS

This application is a U.S. national phase application filed under 35 U.S.C. § 371 of International Application No PCT/JP2020/001384, filed Jan. 16, 2020, which is incorporated herein by reference in its entirety.

TECHNICAL FIELD

The present invention relates to a polishing agent, a stock solution for a polishing agent, and a polishing method.

BACKGROUND ART

In recent years, new microfabrication technologies have been developed along with the tendencies of higher integration and higher performance of semiconductor integrated circuits (hereinafter, also referred to as "LSI"). Chemical mechanical polishing (hereinafter, also referred to as "CMP") is one of such technologies, and is a technique that is frequently used in the LSI manufacturing process (in particular, flattening of interlayer insulating material, formation of metal plug, formation of buried wiring and the like in multilayer interconnection forming process).

Furthermore, along with the tendencies of higher integration and higher performance of LSI, a semiconductor integrated circuit using a plurality of insulating materials has been proposed (for example, Patent Literature 1 below). In such a semiconductor integrated circuit, for example, there is a process in which an insulating material having a low relative permittivity such as an organic silicon oxide (a silicon oxide containing carbon; also called "SiOC") is used in a wiring step and a material such as a silicon oxide not containing a carbon atom is used for an insulating material in a via step.

CITATION LIST

Patent Literature

Patent Literature 1: International Publication WO 2010/084535

Patent Literature 2: Japanese Patent No. 4564735

Patent Literature 3: Japanese Unexamined Patent Publication No. 2010-129871

Patent Literature 4: Japanese Unexamined Patent Publication No. 2011-23448

SUMMARY OF INVENTION

Technical Problem

In such a process, a step is also conceivable in which an excess part of the organic silicon oxide is removed by CMP and polishing is stopped by an insulating material containing silicon (excluding the organic silicon oxide; for example, a silicon oxide not containing a carbon atom and a silicon nitride generally used as a stopper material of CMP) existing in the lower layer. However, it was difficult to stop polishing by the insulating material containing silicon while the organic silicon oxide is polished. In particular, since the organic silicon oxide and the silicon oxide not containing a carbon atom have chemical compositions remarkably similar to each other, although there are a polishing agent capable of polishing both the materials and a polishing agent of suppressing polishing of the organic silicon oxide while polishing the silicon oxide by using hydrophobicity of carbon (for example, Patent Literatures 2 to 4 above), it was difficult to develop a polishing agent of suppressing polishing of the silicon oxide not containing a carbon atom while polishing the organic silicon oxide.

The present inventors have conceived a polishing agent having an effect in which an organic silicon oxide is polished but polishing of other insulating material containing silicon, particularly, silicon dioxide which is a silicon oxide not containing a carbon atom, is suppressed (an effect as a polishing inhibitor), and have solved the above-described problems.

The present invention has been designed to solve the above-described problems, and an object thereof is to provide a polishing agent, a stock solution for a polishing agent, and a polishing method that can selectively remove an organic silicon oxide with respect to silicon dioxide.

Solution to Problem

The present inventors have conducted intensive studies, and as a result, have found that an organic silicon oxide can be removed at a favorable polishing rate by using a polishing agent which uses abrasive grains containing silica and having a positive charge in the polishing agent and a tertiary and/or quaternary allylamine-based polymer, and has a pH of 2.8 to 5.0, and have found a composition that enables polishing of other insulating material containing silicon (such as a silicon oxide not containing a carbon atom (silicon dioxide or the like); or a silicon nitride) to be stopped.

That is, a polishing agent of the present invention is a polishing agent for polishing a base substrate having an organic silicon oxide and an insulating material containing silicon (excluding the organic silicon oxide) to remove at least a part of the organic silicon oxide, the polishing agent containing abrasive grains containing silica and an allylamine-based polymer, in which the abrasive grains have a positive charge in the polishing agent, the allylamine-based polymer is at least one selected from the group consisting of a tertiary allylamine-based polymer and a quaternary allylamine-based polymer, and a pH of the polishing agent is 2.8 to 5.0.

A stock solution for a polishing agent of the present invention is a stock solution for a polishing agent for obtaining the above-described polishing agent, in which the stock solution is diluted with water to obtain the above-described polishing agent. In this case, it is possible to reduce the cost, the space, and the like which are necessary for transportation, storage, and the like of the polishing agent.

A first embodiment of a polishing method of the present invention includes: a step of preparing a base substrate having an organic silicon oxide and an insulating material containing silicon (excluding the organic silicon oxide); and a polishing step of polishing the base substrate by using the above-described polishing agent to remove at least a part of the organic silicon oxide. A second embodiment of the polishing method of the present invention includes: a step of preparing a base substrate having an organic silicon oxide and an insulating material containing silicon (excluding the organic silicon oxide); a step of diluting the above-described stock solution for a polishing agent with water to obtain the polishing agent; and a polishing step of polishing the base substrate by using the polishing agent to remove at least a part of the organic silicon oxide. According to these polishing methods, the organic silicon oxide can be removed at a favorable polishing rate, and the organic silicon oxide can be selectively removed with respect to the insulating material other than the organic silicon oxide.

Advantageous Effects of Invention

According to the present invention, it is possible to provide a polishing agent, a stock solution for a polishing agent, and a polishing method that can selectively remove an organic silicon oxide with respect to silicon dioxide. Furthermore, according to the present invention, it is possible to provide a polishing agent, a stock solution for a polishing agent, and a polishing method that can selectively remove an organic silicon oxide with respect to an insulating material containing silicon (a silicon oxide not containing a carbon atom, a silicon nitride, or the like; excluding the organic silicon oxide) other than silicon dioxide. Further, according to the polishing agent, the stock solution for a polishing agent, and the polishing method of the present invention, the organic silicon oxide can be polished at a favorable polishing rate.

Furthermore, according to the present invention, it is possible to provide use of the polishing agent or the stock solution for a polishing agent for polishing in which a base substrate having an organic silicon oxide and an insulating material containing silicon (excluding the organic silicon oxide) is polished to remove at least a part of the organic silicon oxide. According to the present invention, it is possible to provide use of the polishing agent or the stock solution for a polishing agent for double patterning.

BRIEF DESCRIPTION OF DRAWINGS

FIG. 1 is a schematic cross-sectional view illustrating a polishing method of an embodiment.

DESCRIPTION OF EMBODIMENTS

Definition

In the present specification, the term "step" includes not only an independent step but also a step by which an intended action of the step is achieved, though the step cannot be clearly distinguished from other steps.

In the present specification, "to" indicates the range that includes the numerical values which are described before and after "to", as the minimum value and the maximum value, respectively.

In the present specification, when a plurality of substances corresponding to each component exist in the composition, the content of each component in the composition means the total amount of the plurality of substances that exist in the composition, unless otherwise specified.

In the present specification, "polishing rate (Removal Rate)" means a rate at which the material to be polished is removed per unit time.

In the present specification, the expression "to selectively remove a material A with respect to a material B" means that the material A is more preferentially removed than the material B. More specifically, in a base substrate in which the material A and the material B coexist with each other, the expression means that the material A is more preferentially removed than the material B.

In the present specification, "to dilute stock solution for polishing agent to X times" means such dilution that the mass of the polishing agent is X times the mass of the stock solution for the polishing agent when the polishing agent is obtained by adding water or the like to the stock solution for the polishing agent. For example, obtaining the polishing agent by adding water of the same mass as the mass of the stock solution for the polishing agent to the stock solution is defined as an operation of diluting the stock solution for the polishing agent to twice.

Hereinafter, embodiments of the present invention will be described. However, the present invention is not limited to the following embodiments.

<Polishing Agent>

A polishing agent of the present embodiment is a composition which is in contact with a surface to be polished during polishing, and is, for example, a polishing agent for chemical mechanical polishing (CMP).

The polishing agent of the present embodiment is a polishing agent for chemically-mechanically polishing a base substrate having an organic silicon oxide and an insulating material containing silicon (excluding the organic silicon oxide) to remove at least a part of the organic silicon oxide. The polishing agent of the present embodiment contains at least abrasive grains containing silica and an allylamine-based polymer. The abrasive grains have a positive charge in the polishing agent, the allylamine-based polymer is at least one selected from the group consisting of a tertiary allylamine-based polymer and a quaternary allylamine-based polymer, and the pH of the polishing agent is 2.8 to 5.0.

The organic silicon oxide is a silicon oxide containing carbon and may be also called "organic silicon oxide" or "carbon-containing silicon". The amount of carbon in the organic silicon oxide in the present specification as measured by X-ray photoelectron spectroscopy (XPS) is preferably 10 to 95 atm %.

The amount of carbon in the organic silicon oxide is preferably 10 atm % or more, more preferably 15 atm % or more, and further preferably 20 atm % or more, from the viewpoint of effectively obtaining an effect of removing the organic silicon oxide at a high polishing rate. The amount of carbon in the organic silicon oxide is preferably 95 atm % or less, more preferably 93 atm % or less, and further preferably 91 atm % or less, from the viewpoint of effectively obtaining an effect of removing the organic silicon oxide at a high polishing rate.

The amount of carbon in the organic silicon oxide is measured by X-ray photoelectron spectroscopy. The analysis by X-ray photoelectron spectroscopy can be performed, for example, by using "PHI-5000-VersaProbe II" manufactured by ULVAC-PHI, Inc. In this case, a monochromatic Al-Kα ray (1486.6 eV) can be used as an X-ray source. As for the measurement conditions, for example, the detection angle is 45 degrees, the analysis area is 200 μmΦ, the voltage is 15 kV, and the output is 50 W. The amount of carbon is obtained by measuring the spectra of C1s (280 to 300 eV), performing charge correction by setting the peak top of the obtained C1s at 284.3 eV, and determining the peak areas of C1s.

The organic silicon oxide is not particularly limited as long as it has at least a silicon atom, a carbon atom, and an oxygen atom. Examples of the organic silicon oxide include Black diamond series (manufactured by Applied Materials, Inc.), and low-k materials or an Uttara Low-k materials such as Aurora, Coral, and organosilicate glass. A method for forming the organic silicon oxide is not particularly limited, and examples thereof include a vapor-deposition method and a spin coating method. The shape of the organic silicon oxide is not particularly limited, but is, for example, a film shape. The organic silicon oxide may be doped with an element such as phosphorus or boron.

An insulating material containing silicon (hereinafter, also simply referred to as "insulating material") other than the organic silicon oxide is not particularly limited, and well-known insulating materials can be widely used. The insulating material can also referred to as a silicon-based insulating material. More specific examples of the insulating material include silicon oxides such as silicon monoxide and silicon dioxide; silica-based materials such as fluorosilicate glass, silicon oxynitride (SiON), and hydrogenated silsesquioxane; silicon carbide; and silicon nitrides such as silicon nitride. The insulating material may be doped with an element such as phosphorus or boron.

It is conceivable that, for example, in the case of removing the organic silicon oxide by CMP, by using the abrasive grains having a positive charge in the polishing agent, the polishing rate for the organic silicon oxide is easily increased. Furthermore, it is conceivable that the abrasive grains containing silica has higher affinity with the organic silicon oxide than other kinds of abrasive grains and the contact frequency between the abrasive grains containing silica and the organic silicon oxide is increased. Therefore, it is conceivable that, by using the abrasive grains containing silica and having a positive charge in the polishing agent, the polishing rate for the organic silicon oxide is increased.

On the other hand, the abrasive grains containing silica also has high affinity with respect to the insulating material. Furthermore, since the surface of an insulating material has a negative charge in a wide range of a pH region, the abrasive grains having a positive charge in the polishing agent is electrostatically adsorbed to the insulating material. Therefore, when the abrasive grains containing silica and having a positive charge in the polishing agent is used, the polishing rate for not only the organic silicon oxide but also the insulating material tends to be increased.

However, the present inventors have found that, when the polishing agent contains a predetermined allylamine-based polymer, the polishing rate for the insulating material containing silicon (excluding the organic silicon oxide) can be considerably decreased, and the polishing rate for the organic silicon oxide is only slightly decreased or is not almost changed.

The above-described effect is conceivable to be obtained due to the following reasons. That is, it is conceivable that the allylamine-based polymer is more preferentially adsorbed to the surface of the insulating material containing silicon (excluding the organic silicon oxide) than the organic silicon oxide. Therefore, a protective film generated attributable to the allylamine-based polymer is more preferentially formed on the surface of the above-described insulating material than the organic silicon oxide. Thus, it is conceivable that, since the contact frequency between the abrasive grains and the above-described insulating material is decreased, the polishing rate for the above-described insulating material is decreased.

As described above, according to the polishing agent of the present embodiment, the organic silicon oxide can be removed at a favorable polishing rate, and the organic silicon oxide can be selectively removed with respect to the insulating material containing silicon (excluding the organic silicon oxide). In other words, according to the polishing agent of the present embodiment, a high polishing rate for the organic silicon oxide is obtainable, and a high polishing selection ratio of the organic silicon oxide with respect to the insulating material containing silicon (excluding the organic silicon oxide) (the polishing rate for the organic silicon oxide/the polishing rate for the insulating material containing silicon (excluding the organic silicon oxide)) is obtainable.

Hereinafter, components and the like that are contained in the polishing agent of the present embodiment will be described in detail.

(Abrasive Grains)

The polishing agent of the present embodiment contains abrasive grains containing silica. The abrasive grains have a positive charge in the polishing agent. It is conceivable that, since the affinity of silica with the organic silicon oxide is higher than other kinds of abrasive grains, in the case of using silica as the abrasive grains, the contact frequency between the abrasive grains and the organic silicon oxide is increased.

It can be determined whether or not the abrasive grains have a positive charge in the polishing agent by measuring a zeta potential of the abrasive grains in the polishing agent. In a case where the zeta potential of the abrasive grains in the polishing agent is measured and the numerical value exceeds 0 mV, it can be determined that the abrasive grains have a positive charge.

The zeta potential can be measured, for example, with trade name: DELSA NANO C manufactured by Beckman Coulter, Inc. The zeta potential ($\zeta$[mV]) can be measured according to the following procedure. First, a sample is obtained by diluting the polishing agent with pure water in a zeta potential measurement apparatus so that the scattering intensity of a measurement sample becomes $1.0\times10^4$ to $5.0\times10^4$ cps (here, "cps" means counts per second, which is a unit of the number of particles counted). Then, the sample is placed in a cell for measuring the zeta potential, and the zeta potential is measured. In order to adjust the scattering intensity to the above-described range, for example, the polishing agent is diluted so that the content of the abrasive grains is adjusted to 1.7 to 1.8% by mass.

Examples of a method for adjusting the abrasive grains so as to have the positive charge in the polishing agent include a method of controlling a method for producing abrasive grains, a method of adjusting a pH of the polishing agent, and a method of subjecting the abrasive grains to surface treatment. The case where silica is used as the abrasive grains will be taken as an example and be described. General silica has a negative charge in a liquid, but tends to have a positive charge by lowering a pH. Furthermore, it is also possible to surface-treat silica, with the use of a coupling agent having a cationic group.

The zeta potential is preferably 10 mV or more, more preferably 15 mV or more, and further preferably 18 mV or more, from the viewpoint of obtaining a further favorable polishing rate and storage stability. The upper limit of the zeta potential is not particularly limited, and is, for example, 100 mV.

Examples of silica include colloidal silica and fumed silica. Among these, silica is preferably colloidal silica from the viewpoint that the polishing rate for the organic silicon oxide is further increased, the viewpoint that polishing scratches (indicating scratches appearing on the polished surface after polishing) are few, and the viewpoint that the selection of the particle diameter is easy.

The abrasive grains can include particles other than silica. For example, the abrasive grains may include particles of alumina, ceria, zirconia, a hydroxide of cerium, a resin, or the like. The abrasive grains can be used singly or in combination of two or more kinds thereof.

The content of silica is preferably more than 50% by mass, more preferably 60% by mass or more, further preferably 70% by mass or more, particularly preferably 80% by mass or more, extremely preferably 90% by mass or more, and highly preferably 95% by mass or more, on the basis of the total mass of the abrasive grains, from the viewpoint that the polishing rate for the organic silicon oxide is further increased.

The content of silica is preferably 0.005 parts by mass or more, more preferably 0.05 parts by mass or more, further preferably 0.10 parts by mass or more, and particularly preferably 0.15 parts by mass or more, with respect to 100 parts by mass of the polishing agent, from the viewpoint that a sufficient mechanical polishing force is easily obtained and the polishing rate for the organic silicon oxide is further increased. The content of silica is preferably 15 parts by mass or less, more preferably 10 parts by mass or less, further preferably 5 parts by mass or less, and particularly preferably 3 parts by mass or less, with respect to 100 parts by mass of the polishing agent, from the viewpoint that it is easy to avoid an increase in viscosity of the polishing agent, the viewpoint that it is easy to avoid the aggregation of the abrasive grains, the viewpoint that it is easy for polishing scratches to be reduced, the viewpoint that it is easy to handle the polishing agent, and the like.

The content of the abrasive grains is preferably 0.01 parts by mass or more, more preferably 0.05 parts by mass or more, further preferably 0.1 parts by mass or more, particularly preferably 0.5 parts by mass or more, and extremely preferably 1 part by mass or more, with respect to 100 parts by mass of the polishing agent, from the viewpoint that it is easy to obtain a sufficiently significant polishing rate for the organic silicon oxide as compared to the polishing rate for the organic silicon oxide in the case of not containing abrasive grains. The content of the abrasive grains is preferably 10 parts by mass or less, more preferably 6 parts by mass or less, further preferably 4 parts by mass or less, and particularly preferably 3 parts by mass or less, with respect to 100 parts by mass of the polishing agent, from the viewpoint that the dispersion stability of the abrasive grains is favorable while the polishing rate for the organic silicon oxide is improved.

The average particle diameter of the abrasive grains is preferably 10 nm or more, more preferably 30 nm or more, and further preferably 40 nm or more, from the viewpoint that a sufficient mechanical polishing force is easily obtained and the polishing rate for the organic silicon oxide is further increased. The average particle diameter of the abrasive grains is preferably 200 nm or less, more preferably 120 nm or less, and further preferably 90 nm or less, from the viewpoint that the dispersion stability of the abrasive grains is favorable.

The average particle diameter of the abrasive grains can be measured by a photon correlation method. More specifically, the average particle diameter can be measured, for example, using device name: Zetasizer 3000HS manufactured by Malvern Instruments, device name: Delsa MAX Pro manufactured by Beckman Coulter, Inc., and the like. A measurement method using Delsa MAX Pro is as described below. For example, an aqueous dispersion in which the content of the abrasive grains is adjusted to 0.2% by mass is prepared, about 4 mL (L represents "liter"; the same applies hereinafter) of this aqueous dispersion is introduced into a 1-cm square cell, and then the cell is placed in the apparatus. A value obtainable by performing measurement at 25° C. with a refractive index and a viscosity of a dispersion medium set to 1.33 and 0.887 mPa·s can be adopted as the average particle diameter of the abrasive grains.

(Allylamine-Based Polymer)

The polishing agent of the present embodiment contains an allylamine-based polymer. In the present specification, the "allylamine-based polymer" is defined as a polymer having a structural unit obtained by the polymerization of monomers containing an allylamine-based compound. In the present specification, the "allylamine-based compound" is defined as a compound having an allyl group and an amino group. The allylamine-based polymer may have a structural unit obtained by the polymerization of only allylamine-based compounds, and may have a structural unit obtained by the copolymerization of the allylamine-based compound and a compound other than the allylamine-based compound. The allylamine-based compound can be used singly or in combination of two or more kinds thereof.

In the polishing agent of the present embodiment, the allylamine-based polymer is at least one selected from the group consisting of a tertiary allylamine-based polymer and a quaternary allylamine-based polymer, from the viewpoint that it is easy to selectively remove the organic silicon oxide with respect to the insulating material. The tertiary allylamine-based polymer or the quaternary allylamine-based polymer is a polymer having a structural unit which is obtained by the polymerization of monomers containing an allylamine compound having an allyl group and a tertiary amino group, or an allyl group and a quaternary amino group.

The weight average molecular weight of the allylamine-based polymer is preferably 500 or more, more preferably 800 or more, and further preferably 1000 or more, from the viewpoint of easily suppressing the polishing rate for the insulating material. The weight average molecular weight of the allylamine-based polymer is preferably 300000 or less, more preferably 200000 or less, and further preferably 150000 or less, from the viewpoint that an excessive increase in viscosity is suppressed and consequently favorable storage stability is obtained.

The weight average molecular weight (Mw) of the allylamine-based polymer can be measured, for example, using gel permeation chromatography (GPC) under the following conditions.

[Conditions]

Sample: 20 μL

Standard polyethylene glycol: Standard polyethylene glycol (molecular weight: 106, 194, 440, 600, 1470, 4100, 7100, 10300, 12600, and 23000) manufactured by Polymer Laboratories Co., Ltd.

Detector: RI-monitor, trade name "Syodex-RI SE-61" manufactured by Showa Denko K.K.

Pump: Manufactured by Hitachi, Ltd., trade name "L-6000"

Column: trade names "GS-220 HQ" and "GS-620 HQ" manufactured by Showa Denko K.K. were connected in this order and used.

Eluent: 0.4 mol/L aqueous solution of sodium chloride

Measurement temperature: 30° C.

Flow rate: 1.00 mL/min

Measurement time: 45 min

The content of the allylamine-based polymer is preferably 0.001 parts by mass or more, more preferably 0.003 parts by mass or more, further preferably 0.004 parts by mass or more, and particularly preferably 0.005 parts by mass or more, with respect to 100 parts by mass of the polishing agent, from the viewpoint of easily suppressing the polishing rate for the insulating material. The content of the allylamine-based polymer is preferably 0.4 parts by mass or less, more preferably 0.3 parts by mass or less, further preferably 0.2 parts by mass or less, particularly preferably 0.1 parts by mass or less, and extremely preferably 0.05 parts by mass or less, with respect to 100 parts by mass of the polishing agent, from the viewpoint of suppressing a decrease in the polishing rate for the organic silicon oxide and easily maintaining a high polishing rate ratio of the organic silicon oxide with respect to the insulating material.

The mass ratio of the content of the allylamine-based polymer with respect to the content of the abrasive grains (the content of the allylamine-based polymer/the content of the abrasive grains) is preferably 0.002 or more from the viewpoint of selectively removing the organic silicon oxide with respect to the insulating material. The mass ratio is more preferably 0.003 or more and further preferably 0.005 or more, from the viewpoint that it is easy to selectively remove the organic silicon oxide with respect to the insulating material.

The mass ratio of the content of the allylamine-based polymer with respect to the content of the abrasive grains is preferably 0.4 or less from the viewpoint of removing the organic silicon oxide at a favorable polishing rate. The mass ratio is more preferably 0.3 or less and further preferably 0.2 or less, from the viewpoint that it is easy to remove the organic silicon oxide at a favorable polishing rate.

The allylamine-based polymer preferably has at least one selected from the group consisting of a structural unit represented by Formula (I) below, a structural unit represented by Formula (II) below, a structural unit represented by Formula (III) below, a structural unit represented by Formula (IV) below, and a structural unit represented by Formula (V) below in a molecule of the polymer, from the viewpoint of further selectively removing the organic silicon oxide with respect to the insulating material. In this case, since the allylamine-based polymer reduces the contact frequency between the insulating material and the abrasive grains to further suppress the polishing rate for the insulating material, the organic silicon oxide can be further selectively removed with respect to the insulating material.

[Chemical Formula 1]

(I)

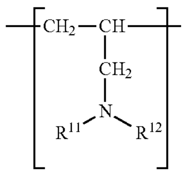

[In the formula, $R^{11}$ and $R^{12}$ each independently represent an alkyl group or an aralkyl group, and an amino group may form an acid addition salt.]

[Chemical Formula 2]

(II)

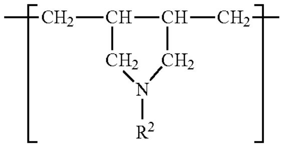

[In the formula, $R^2$ represents an alkyl group or an aralkyl group, and a nitrogen-containing ring may form an acid addition salt.]

[Chemical Formula 3]

(III)

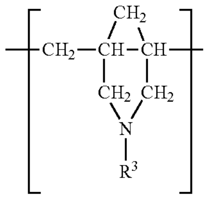

[In the formula, $R^3$ represents an alkyl group or an aralkyl group, and a nitrogen-containing ring may form an acid addition salt.]

[Chemical Formula 4]

(IV)

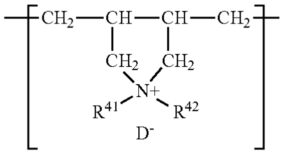

[In the formula, $R^{41}$ and $R^{42}$ each independently represent an alkyl group or an aralkyl group, and $D^-$ represents a monovalent anion.]

[Chemical Formula 5]

(V)

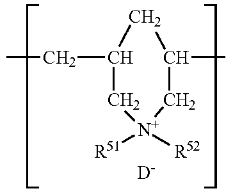

[In the formula, $R^{51}$ and $R^{52}$ each independently represent an alkyl group or an aralkyl group, and $D^-$ represents a monovalent anion.]

The allylamine-based polymer may have a single structural unit or two or more kinds thereof as the structural units (I) to (V). The total number of the structural units (I) to (V) in a molecule is preferably 5 or more, more preferably 7 or more, and further preferably 10 or more, from the viewpoint of easily suppressing the polishing rate for the insulating material. Here, the total number of the structural units (I) to (V) in a molecule is an average value of the allylamine-based polymer contained in the polishing agent.

The alkyl groups corresponding to $R^{11}$, $R^{12}$, $R^2$, and $R^3$ in Formulae (I), (II), and (III) may be any of a linear form, a branched form, and a cyclic form. The number of carbon atoms in the alkyl group is preferably 1 or more, from the viewpoint of easily suppressing the polishing rate for the insulating material. The number of the carbon atoms in the alkyl group is preferably 10 or less, more preferably 7 or less, further preferably 5 or less, and particularly preferably 4 or less, from the viewpoint of easily suppressing the polishing rate for the insulating material.

The alkyl groups corresponding to $R^{11}$, $R^{12}$, $R^2$, and $R^3$ may each have a hydroxyl group. Examples of the alkyl groups corresponding to $R^{11}$, $R^{12}$, $R^2$, and $R^3$ include a methyl group, an ethyl group, an n-propyl group, an isopropyl group, an n-butyl group, an iso-butyl group, a tert-butyl group, a cyclohexyl group, and hydroxyl group adducts thereof (a 3-hydroxypropyl group and the like).

The aralkyl group refers to a group in which one of the hydrogen atoms in the alkyl group is substituted with an aryl group. Here, the alkyl group constituting the aralkyl groups corresponding to $R^{11}$, $R^{12}$, $R^2$, and $R^3$ in Formulae (I), (II), and (III) may be any of a linear form, a branched form, and a cyclic form. The number of carbon atoms in the aralkyl group is preferably 7 to 10, from the viewpoint of easily suppressing the polishing rate for the insulating material.

The aralkyl groups corresponding to $R^{11}$, $R^{12}$, $R^2$, and $R^3$ may each have a hydroxyl group. Examples of the aralkyl groups include a benzyl group, a phenethyl group, a phenylpropyl group, a phenylbutyl group, a phenylhexyl group, and hydroxyl group adducts thereof.

The amino group in Formula (I) and the nitrogen-containing rings in Formulae (II) and (III) may form an acid addition salt. Examples of the acid addition salts include hydrochloride, hydrobromide, acetate, sulfate, nitrate, sulfite, phosphate, amide sulfate, and methanesulfonate. Among these, hydrochloride, acetate, and amide sulfate are preferred, from the viewpoint that a higher polishing rate ratio of the organic silicon oxide with respect to the insulating material is obtained.

Among the above-described examples, $R^{11}$, $R^{12}$, $R^2$, and $R^3$ are preferably a methyl group and an ethyl group from the viewpoint that the wettability with an insulating material (for example, silicon oxide) is favorable.

Among the allylamine-based polymers having the structural units represented by Formulae (I), (II), or (III), an allylamine polymer and a diallylamine polymer are preferred from the viewpoint of obtaining a higher polishing selection ratio of the organic silicon oxide with respect to an insulating material. From the same viewpoint, the structural unit containing the acid addition salt is preferably diallylamine hydrochloride, methyldiallylamine hydrochloride, ethyldiallylamine hydrochloride, methyldiallylamine acetate, and methyldiallylamineamide sulfate.

The alkyl groups corresponding to $R^{41}$, $R^{42}$, $R^{51}$, and $R^{52}$ in Formulae (IV) and (V) may be any of a linear form, a branched form, and a cyclic form. The number of carbon atoms in the alkyl group corresponding to $R^{41}$ and $R^{42}$ is preferably 1 or more from the viewpoint of easily suppressing the polishing rate for the insulating material. The number of the carbon atoms in the alkyl group corresponding to $R^{41}$ and $R^{42}$ is preferably 10 or less, more preferably 7 or less, and further preferably 4 or less, from the viewpoint of easily suppressing the polishing rate for the insulating material. The number of carbon atoms in the alkyl groups corresponding to $R^{51}$ and $R^{52}$ is preferably 1 or more, from the viewpoint of easily suppressing the polishing rate for the insulating material. The number of the carbon atoms in the alkyl group corresponding to $R^{51}$ and $R^{52}$ is preferably 10 or less, more preferably 7 or less, and further preferably 4 or less, from the viewpoint of easily suppressing the polishing rate for the insulating material.

The alkyl groups corresponding to $R^{41}$ and $R^{42}$ may each have a hydroxyl group. Examples of the alkyl groups corresponding to $R^{41}$ and $R^{42}$ include a methyl group, an ethyl group, an n-propyl group, an isopropyl group, an n-butyl group, an iso-butyl group, a tert-butyl group, a cyclohexyl group, and hydroxyl group adducts thereof (3-hydroxypropyl group and the like).

Examples of the alkyl groups corresponding to $R^{51}$ and $R^{52}$ include a methyl group, an ethyl group, an n-propyl group, an isopropyl group, an n-butyl group, an iso-butyl group, a tert-butyl group, and a cyclohexyl group.

The alkyl group constituting the aralkyl groups corresponding to $R^{41}$, $R^{42}$, $R^{51}$, and $R^{52}$ in Formulae (IV) and (V) may be any of a linear form, a branched form, and a cyclic form. The number of carbon atoms in the aralkyl group is preferably 7 to 10, from the viewpoint of easily suppressing the polishing rate for the insulating material.

The aralkyl groups corresponding to $R^{41}$ and $R^{42}$ may each have a hydroxyl group. Examples of the aralkyl groups include a benzyl group, a phenethyl group, a phenylpropyl group, a phenylbutyl group, and hydroxyl group adducts thereof.

Examples of the aralkyl groups corresponding to $R^{51}$ and $R^{52}$ include a benzyl group, a phenethyl group, a phenylpropyl group and a phenylbutyl group.

Among the above-described examples, $R^{41}$, $R^{42}$, $R^{51}$, and $R^{52}$ are preferably a methyl group, a benzyl group, and a phenethyl group from the viewpoint that the wettability with an insulating material (for example, silicon oxide) is favorable.

Examples of $D^-$ in Formulae (IV) and (V) include halogen ions such as $Cl^-$, $Br^-$, and $I^-$; and alkyl sulfate ions such as a methyl sulfate ion, an ethyl sulfate ion and a dimethyl sulfate ion.

Examples of a partial structure represented by Formula (IVa) below in Formula (IV) and a partial structure represented by Formula (Va) below in Formula (V) include N,N-dialkylammonium salts and N-alkyl-N-benzyl ammonium salts. Examples of the N,N-dialkylammonium salts include N,N-dialkylammonium halides such as N,N-dimethylammonium halide, N,N-diethylammonium halide, N,N-dipropylammonium halide, and N,N-dibutylammonium halide; and N,N-dialkylammonium alkyl sulfates such as N,N-dimethylammonium methyl sulfate and N,N-methylethylammonium ethyl sulfate. Examples of the N-alkyl-N-benzyl ammonium salts include N-alkyl-N-benzylammonium halides such as N-methyl-N-benzylammonium halide and N-ethyl-N-benzylammonium halide. Examples of the halides of the above-described partial structure include chloride, bromide, and iodide. Among structural units having these partial structures, N,N-dimethylammonium chloride and N,N-methylethylammonium ethyl sulfate are preferred, from the viewpoint that a higher polishing rate ratio of the organic silicon oxide with respect to the insulating material is obtained.

[Chemical Formula 6]

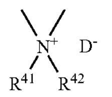

(IVa)

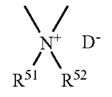

(Va)

The allylamine-based polymer may have a structure obtained by the copolymerization of an allylamine-based compound and a compound other than the allylamine-based compound. The allylamine-based polymer may have, for example, a structure obtained by the copolymerization of a monomer which gives at least one structural unit selected from the group consisting of a structural unit represented by Formula (I), a structural unit represented by Formula (II), a structural unit represented by Formula (III), a structural unit represented by Formula (IV), and a structural unit represented by Formula (V), and a monomer other than the allylamine-based compound.

The allylamine-based polymer may further have at least one selected from the group consisting of a structural unit represented by Formula (VI) below, a structural unit represented by Formula (VII) below, a structural unit represented by Formula (VIII) below, and a structural unit represented by Formula (IX) below. For example, the allylamine-based polymer may have at least one structural unit selected from the group consisting of a structural unit represented by Formula (I), a structural unit represented by Formula (II), a structural unit represented by Formula (III), a structural unit represented by Formula (IV), and a structural unit represented by Formula (V), and at least one structural unit selected from the group consisting of a structural unit represented by Formula (VI) below, a structural unit represented by Formula (VII) below, a structural unit represented by Formula (VIII) below, and a structural unit represented by Formula (IX) below.

[Chemical Formula 7]

(VI)

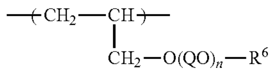

[In the formula, Q represents an alkylene group, $R^6$ represents a hydrogen atom or an alkyl group, and n represents an average number of addition moles of 0 to 30.]

[Chemical Formula 8]

(VII)

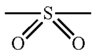

[Chemical Formula 9]

(VIII)

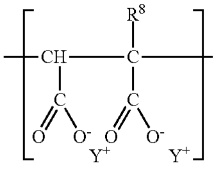

[In the formula, $R^8$ represents a hydrogen atom or an alkyl group, and $Y^+$ represents a cation.]

[Chemical Formula 10]

(IX)

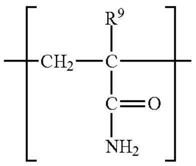

[In the formula, $R^9$ represents a hydrogen atom or an alkyl group.]

When n is 0, examples of the monomers which give the structural unit represented by Formula (VI) include allyl alcohols. When n is 1 to 30, examples of the monomers which give the structural unit represented by Formula (VI) include (poly)oxyalkylene monoallyl ethers and (poly)oxyalkylene monoallyl monomethyl ethers. In this case, the alkylene group represented by Q is preferably a straight-chain or branched-chain alkylene group having 2 to 3 carbon atoms and more preferably an ethylene group, a trimethylene group, and a propylene group, from the viewpoint of easily suppressing the polishing rate for the insulating material. The alkylene group may be introduced singly, or two or more kinds thereof may be introduced in combinations. $R^6$ is preferably a hydrogen atom and a methyl group from the viewpoint of easily suppressing the polishing rate for the insulating material.

The allylamine-based polymer having the structural unit represented by Formula (VI) is preferably a methyldiallylamine hydrochloride/allyl alcohol copolymer, from the viewpoint that the polishing rate ratio of the organic silicon oxide with respect to the insulating material is further increased.

Examples of the monomer which gives the structural unit represented by Formula (VII) include sulfur dioxide. The allylamine-based polymers having the structural unit represented by Formula (VII) is preferably a diallylamine hydrochloride/sulfur dioxide copolymer, from the viewpoint that a higher polishing rate ratio of the organic silicon oxide with respect to the insulating material is obtained.

$R^8$ in Formula (VIII) is preferably a hydrogen atom and a methyl group and more preferably a hydrogen atom, from the viewpoint of easily suppressing the polishing rate for the insulating material. Examples of $Y^+$ include alkali metal ions such as a sodium ion and a potassium ion; a hydrogen ion; and an ammonium ion.

Examples of monomers which give the structural unit represented by Formula (VIII) include maleic acid, fumaric acid, citraconic acid, itaconic acid, mesaconic acid and 2-allylmalonic acid, and among these, the maleic acid is preferred from the viewpoint of easily decreasing the polishing rate for the insulating material and the viewpoint that the dispersibility of the allylamine-based polymer in the polishing agent is favorable.

The allylamine-based polymer having the structural unit represented by Formula (VIII) is preferably a diallylamine hydrochloride/maleic acid copolymer and a diallylamine amide sulfate/maleic acid copolymer, from the viewpoint that a higher polishing rate ratio of the organic silicon oxide with respect to the insulating material is obtained.

$R^9$ in Formula (IX) is preferably a hydrogen atom and a methyl group and more preferably a hydrogen atom, from the viewpoint of easily suppressing the polishing rate for the insulating material. Examples of monomers which give the structural unit represented by Formula (IX) include acrylamide.

The allylamine-based polymer having the structural unit represented by Formula (IX) is preferably a diallylmethylammonium chloride/acrylamide copolymer and a diallyldimethylammonium chloride/acrylamide copolymer, from the viewpoint that a higher polishing rate ratio of the organic silicon oxide with respect to the insulating material is obtained.

The allylamine-based polymer is preferably a methyldiallylamine hydrochloride polymer, a methyldiallylamine-amide sulfate polymer, a diallyldimethylammonium chloride/acrylamide copolymer, a diallyldimethylammonium chloride polymer, and a diallylamine hydrochloride/sulfur dioxide copolymer, from the viewpoint that a higher polishing rate ratio of the organic silicon oxide with respect to the insulating material is obtained.

(Water)

The polishing agent of the present embodiment preferably contains water. The water is used as a dispersion medium of other components or as a solvent. As for the water, in order to suppress the inhibition of the action of other components, it is preferable that the water does not contain the impurities as much as possible. Specifically, the water is preferably pure water, ultrapure water, and distilled water from which impurity ions are removed by an ion-exchange resin and then foreign substances are removed through a filter.

(Additive)

The polishing agent of the present embodiment may further a component other than the abrasive grains and the above-described allylamine-based polymer, for the purposes of improving the dispersibility of the abrasive grains in the polishing agent, improving the chemical stability of the polishing agent, improving the polishing rate, or the like. Examples of such a component include additives such as an organic solvent, an acid component, a metal corrosion inhibitor (corrosion inhibitor), and an antifoaming agent. The content of the additive in the polishing agent can be arbitrarily determined within such a range as not to impair the characteristics of the polishing agent.

[Acid Component]

The polishing agent of the present embodiment preferably further contains an acid component. When the polishing agent contains an acid component, the pH of the polishing agent can be adjusted to a predetermined value. When the polishing agent of the present embodiment contains an acid component to control the pH, the liquid state stability of the polishing agent can be enhanced and the polished surface can be further favorably flattened. The acid component is preferably at least one selected from the group consisting of an organic acid and an inorganic acid, from the viewpoint that the dispersibility and stability of the aqueous dispersion and the polishing rate can be further improved. The acid component may be an acid not having an aromatic ring. Examples of the organic acid include formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, glycolic acid, glyceric acid, oxalic acid, malonic acid, succinic acid, glutaric acid, adipic acid, pimelic acid, maleic acid, malic acid, tartaric acid, and citric acid. The inorganic acid is not particularly limited, and examples thereof include hydrochloric acid, sulfuric acid, nitric acid, and chromic acid. In a case where a metal wiring such as cobalt is exposed on the polished surface, from the viewpoint of suppressing the corrosion of the metal wiring, the organic acid is preferred.

[Organic Solvent]

The polishing agent of the present embodiment may contain an organic solvent. When the polishing agent contains the organic solvent, the polishing rate ratio can be adjusted and the wettability of the polishing agent can be improved. Furthermore, when the polishing agent contains an organic solvent, the repulsion of the polishing particles is promoted so that the aggregation of the polishing particles can also be suppressed. The organic solvent is not particularly limited, but is preferably a solvent in a liquid state at 20° C. The degree of solubility of the organic solvent with respect to 100 g of water (20° C.) is preferably 30 g or more, more preferably 50 g or more, and further preferably 100 g or more, from the viewpoint of increasing the concentration of the polishing agent. The organic solvent can be used singly or in combination of two or more kinds thereof.

Examples of the organic solvent include carbonate esters such as ethylene carbonate, propylene carbonate, dimethyl carbonate, diethyl carbonate, and methyl ethyl carbonate; lactones such as butyrolactone and propyl lactone; glycols such as ethylene glycol, propylene glycol, diethylene glycol, dipropylene glycol, triethylene glycol, tripropylene glycol, methanediol, propanediol, butanediol, pentanediol, hexanediol, heptanediol, octanediol, nonanediol, decanediol, butanetriol, pentanetriol, hexanetriol, heptanetriol, octanetriol, nonanetriol, decanetriol, and erythritol; and derivatives of glycols such as glycol monoethers such as ethylene glycol monomethyl ether, propylene glycol monomethyl ether, diethylene glycol monomethyl ether, dipropylene glycol monomethyl ether, triethylene glycol monomethyl ether, tripropylene glycol monomethyl ether, ethylene glycol monoethyl ether, propylene glycol monoethyl ether, diethylene glycol monoethyl ether, dipropylene glycol monoethyl ether, triethylene glycol monoethyl ether, tripropylene glycol monoethyl ether, ethylene glycol monopropyl ether, propylene glycol monopropyl ether, diethylene glycol monopropyl ether, dipropylene glycol monopropyl ether, triethylene glycol monopropyl ether, tripropylene glycol monopropyl ether, ethylene glycol monobutyl ether, propylene glycol monobutyl ether, diethylene glycol monobutyl ether, dipropylene glycol monobutyl ether, triethylene glycol monobutyl ether, and tripropylene glycol monobutyl ether, and glycol diethers such as ethylene glycol dimethyl ether, propylene glycol dimethyl ether, diethylene glycol dimethyl ether, dipropylene glycol dimethyl ether, triethylene glycol dimethyl ether, tripropylene glycol dimethyl ether, ethylene glycol diethyl ether, propylene glycol diethyl ether, diethylene glycol diethyl ether, dipropylene glycol diethyl ether, triethylene glycol diethyl ether, tripropylene glycol diethyl ether, ethylene glycol dipropyl ether, propylene glycol dipropyl ether, diethylene glycol dipropyl ether, dipropylene glycol dipropyl ether, triethylene glycol dipropyl ether, tripropylene glycol dipropyl ether, ethylene glycol dibutyl ether, propylene glycol dibutyl ether, diethylene glycol dibutyl ether, dipropylene glycol dibutyl ether, triethylene glycol dibutyl ether, and tripropylene glycol dibutyl ether. Among these, the organic solvent is preferably at least one selected from the group consisting of glycols and derivatives of the glycols, from the viewpoint that surface tension is low, and more preferably glycol monoethers, from the viewpoint that the surface tension is further low.

In a case where the polishing agent of the present embodiment contains an organic solvent, the content of the organic solvent is preferably 0.1 parts by mass or more, more preferably 0.5 parts by mass or more, and further preferably 1 part by mass or more, with respect to 100 parts by mass of the allylamine-based polymer, from the viewpoint of suppressing a decrease in the wettability of the polishing agent with respect to the organic silicon oxide. The content of the organic solvent is preferably 15 parts by mass or less, more preferably 10 parts by mass or less, and further preferably 5 parts by mass or less, with respect to 100 parts by mass of the allylamine-based polymer, from the viewpoint that dispersion stability is excellent.

[Metal corrosion inhibitor]

The polishing agent of the present embodiment may contain a metal corrosion inhibitor. When the polishing agent contains a metal corrosion inhibitor, in a case where the base substrate has a metal wiring such as a Co or Cu wiring, a via, a plug, a metal gate, or the like, the corrosion of a metal when the metal wiring is exposed on the polished surface can be suppressed.

The metal corrosion inhibitor contained in the polishing agent of the present embodiment is not particularly limited, and it is possible to use any conventionally known compound as a compound having a corrosion preventive effect against a metal. Specifically, it is possible to use at least one selected from the group consisting of a triazole compound, a pyridine compound, a pyrazole compound, a pyrimidine compound, an imidazole compound, a guanidine compound, a thiazole compound, a tetrazole compound, a triazine compound and hexamethylenetetramine Here, the term "compound" is a collective term for compounds having a skeleton thereof, and for example, the triazole compound means a compound having a triazole skeleton.

The metal corrosion inhibitor can be used singly or two or more kinds thereof can be mixed and used. The content of the metal corrosion inhibitor is preferably 0.01% by mass or more and more preferably 0.02% by mass or more, from the viewpoint of suppressing the corrosion of metals. Furthermore, the content of the metal corrosion inhibitor is preferably 5.0% by mass or less and more preferably 0.5% by mass or less, from the viewpoint of suppressing a decrease in the polishing rate for a film to be polished.

The metal corrosion inhibitor enables the etching rate for a copper- or cobalt-based metal to be suppressed even under a severe temperature condition (for example, 60° C.). The reason for this is conceivable that the metal corrosion inhibitor exhibits excellent functions as a complex forming agent and a film protecting agent.

From such a viewpoint, the metal corrosion inhibitor is preferably at least one selected from the group consisting of a triazole compound, a pyridine compound, an imidazole compound, a tetrazole compound, a triazine compound, and hexamethylenetetramine, and more preferably at least one selected from the group consisting of a triazole compound such as 3H-1,2,3-triazolo[4,5-b] pyridine-3-ol, 1-hydroxybenzotriazole, 1H-1,2,3-triazolo[4,5-b]pyridine, benzotriazole, or 5-methyl-1H-benzotriazole, 3-hydroxypyridine, benzimidazole, 5-amino-1H-tetrazole, 3,4-dihydro-3-hydroxy-4-oxo-1,2,4-triazine, and hexamethylenetetramine.

(pH of Polishing Agent)

The pH of the polishing agent of the present embodiment is 2.8 to 5.0 from the viewpoint that it is easy to selectively remove the organic silicon oxide with respect to the insulating material. The pH of the polishing agent is preferably 2.9 or more, more preferably 3.0 or more, and further preferably 3.1 or more, from the viewpoint that it is easy to further selectively remove the organic silicon oxide with respect to the insulating material and the viewpoint that a sufficient mechanical polishing force is easily obtained and the polishing rate for the organic silicon oxide is further improved. The pH of the polishing agent is preferably 4.8 or less, more preferably 4.5 or less, further preferably 4.2 or less, and particularly preferably 4.0 or less, from the viewpoint that the aggregation of the abrasive grains is suppressed to obtain favorable dispersion stability of the abrasive grains. From the above-described viewpoints, the pH of the polishing agent is preferably 2.8 to 4.8, 2.8 to 4.5, 2.8 to 4.2, 2.8 to 4.0, 3.0 to 4.8, 3.0 to 4.5, 3.0 to 4.2, 3.0 to 4.0, 3.1 to 4.8, 3.1 to 4.5, 3.1 to 4.2, or 3.1 to 4.0. The pH of the polishing agent may be adjusted, for example, by the above-described acid component; base components such as ammonia, sodium hydroxide, potassium hydroxide, and TMAH (tetramethylammonium hydroxide); or the like. The pH is defined as the pH at a liquid temperature of 25° C.

The pH of the polishing agent can be measured with a pH meter which uses a general glass electrode. Specifically, for example, trade name: Model (F-51) manufactured by HORIBA, Ltd. can be used. It is possible to obtain by calibrating the pH meter by three points using a pH standard solution (4.01) of a phthalate, a pH standard solution (pH: 6.86) of a neutral phosphate, and a pH standard solution (pH: 9.18) of a borate, as pH standard solutions; then putting an electrode of the pH meter in the polishing agent; and measuring a stable value at the time after 2 minutes or longer elapsed. At this time, the liquid temperatures of the standard buffer solution and the polishing agent are, for example, 25° C.

A method for preparing the polishing agent and a method for diluting the polishing agent are not particularly limited, and for example, each component can be dispersed or dissolved by stirring with a blade stirrer, ultrasonic dispersion, or the like. The mixing order of each component with respect to water is not limited.

The polishing agent of the present embodiment may be stored as a one-pack type polishing agent containing at least the above-described abrasive grains and the above-described allylamine-based polymer, and may be stored as a multi-pack type polishing agent having a slurry (first liquid) and an additive liquid (second liquid). In this case, the liquid state stability of the polishing agent can be enhanced. In the multi-pack type polishing agent, the constituent components of the above-described polishing agent are divided into the slurry and the additive liquid so that the slurry and the additive liquid are mixed to form the above-described polishing agent. The slurry contains, for example, at least abrasive grains. The slurry may contain abrasive grains and water. The additive liquid contains, for example, at least an allylamine-based polymer. The additive liquid may contain an allylamine-based polymer and water. Additives such as an organic solvent, an acid component, a metal corrosion inhibitor, and an antifoaming agent is preferably contained in the additive liquid among the slurry and the additive liquid. Note that, the constituent components of the polishing agent may be stored separately in three or more liquids.

In the multi-pack type polishing agent, the polishing agent may be prepared by mixing the slurry and the additive liquid immediately before polishing or during polishing. It is also acceptable to supply each of the slurry and the additive solution of the multi-pack type polishing agent onto a polishing platen, and to polish the surface to be polished by using the polishing agent obtained by mixing the slurry and the additive liquid on the polishing platen.

<Stock Solution for Polishing Agent>

The stock solution for a polishing agent of the present embodiment is a stock solution for obtaining the above-described polishing agent, in which the stock solution for the polishing agent is diluted with water to obtain the above-described polishing agent. The stock solution for a polishing agent is stored in such a state that the amount of water is reduced rather than that during use, and is used as the above-described polishing agent by being diluted with water before use or during use. The stock solution for a polishing agent is different from the above-described polishing agent in such a point that the content of water is smaller than that in the above-described polishing agent. The dilution ratio is, for example, 1.5 times or more.

<Polishing Method>

Next, a polishing method of the present embodiment will be described.

In the polishing method of the present embodiment, a base substrate having an organic silicon oxide and an insulating material containing silicon (excluding the organic silicon oxide) is polished to selectively polish the organic silicon oxide with respect to the insulating material. The base substrate has, for example, an insulating material (for example, an insulating material film) having concave portions and convex portions on a surface thereof and an organic silicon oxide (for example, an organic silicon oxide film) formed on the insulating material along the shape of the insulating material. The polishing may be chemical mechanical polishing (CMP).

For example, as a polishing step, the polishing method of the present embodiment may include a polishing step of polishing the base substrate by using the one-pack type polishing agent to remove at least a part of the organic silicon oxide, a polishing step of polishing the base substrate by using a polishing agent obtained by mixing the slurry and the additive liquid of the multi-pack type polishing agent to remove at least a part of the organic silicon oxide, or a polishing step of polishing the base substrate by using a polishing agent obtained by diluting the stock solution for a polishing agent with water to remove at least a part of the organic silicon oxide. The polishing may be chemical mechanical polishing (CMP). In the polishing step, polishing may be stopped, for example, when the organic silicon oxide has been polished and consequently the insulating material has been exposed.

The polishing method of the present embodiment may include a step of preparing a base substrate having an organic silicon oxide and an insulating material containing silicon (excluding the organic silicon oxide) before the polishing step.

In the case of using the multi-pack type polishing agent, the polishing method of the present embodiment may include a polishing agent preparation step of mixing the slurry and the additive liquid of the multi-pack type polishing agent to obtain the polishing agent, before the polishing step. In the case of using the stock solution for a polishing agent, the polishing method of the present embodiment may include a polishing agent preparation step of diluting the stock solution for a polishing agent with water to obtain the polishing agent, before the polishing step.

In the polishing step, for example, the surface to be polished of the base material is polished by relatively moving the base substrate with respect to the polishing platen in such a state that the surface to be polished is pressed against a polishing cloth (polishing pad) of the polishing platen, the polishing agent is supplied between the surface to be polished and the polishing cloth, and a predetermined pressure is applied to the rear face (surface opposite to surface to be polished) of the base substrate.

As a polishing apparatus, for example, a general polishing apparatus can be used which has a platen to which a motor that can change the number of revolutions or the like is attached and on which a polishing cloth also can be mounted; and a holder which holds the base substrate. The polishing cloth is not particularly limited, but a general nonwoven fabric, foamed polyurethane, a porous fluororesin, or the like can be used. The polishing condition is not particularly limited, but the rotational speed of the platen is preferably a low rotation of 200 rpm ($=min^{-1}$) or less to suppress the flying-off of the base substrate. For example, during polishing, the polishing agent is continuously supplied to the polishing cloth with a pump or the like. The supply amount is not limited, but it is preferable that the surface of the polishing cloth is always covered with the polishing agent and a product produced by a progress of polishing is continuously discharged.

In order to perform polishing while always keeping the surface state of the polishing cloth constant, the polishing method of the present embodiment preferably includes a conditioning step of a polishing cloth before the polishing step. For example, the conditioning of the polishing cloth is performed with a liquid containing at least water, while using a dresser to which diamond particles attach. The polishing method of the present embodiment preferably includes a base substrate washing step after the polishing step. It is preferable to adequately wash the base substrate after polishing in running water, then perform drying after removing droplets, which have attached onto the base substrate, with the use of a spin dry or the like. Furthermore, it is more preferable to wash the base substrate with a known washing method of removing the deposits on the base substrate by pressing a brush made from polyurethane against the base substrate with a constant pressure while letting a commercially available washing liquid flow on the surface of the base substrate and rotating the brush, and then dry the base substrate.

According to the polishing agent of the present embodiment, a base substrate having an organic silicon oxide and an insulating material containing silicon (excluding the organic silicon oxide) can be polished to remove at least a part of the organic silicon oxide. Furthermore, according to the polishing agent of the present embodiment, the polishing rate for the insulating material can be sufficiently decreased. Therefore, after the base substrate having the organic silicon oxide and the above-described insulating material is polished to remove at least a part of the organic silicon oxide and consequently a part of the insulating material has been exposed, polishing in which polishing does not almost proceed can be performed. Such a polishing agent can be rephrased as "a polishing agent which enables the polishing to be stopped when the organic silicon oxide has been removed and consequently the insulating material containing silicon (excluding the organic silicon oxide) has been exposed", as the term which those skilled in the art can understand.

The polishing agent of the present embodiment can be used in the polishing method requiring a high polishing rate ratio of the organic silicon oxide with respect to the insulating material containing silicon (excluding the organic silicon oxide) by utilizing features as described. Specifically, the polishing method of the present embodiment will be described using FIG. 1.

First, a base substrate, which has a substrate 11, and a silicon oxide 12 and a silicon nitride 13 which have a predetermined pattern and are also formed on the substrate 11, is prepared (FIG. 1(*a*)). The silicon oxide 12 and the silicon nitride 13 correspond to the insulating material containing silicon (excluding the organic silicon oxide). Next, an organic silicon oxide 14 is formed on the substrate 11, the silicon oxide 12, and the silicon nitride 13 by being applied or vapor-deposited, and further cured (FIG. 1(*b*)). The same patterns as the patterns of the silicon oxide 12 and the silicon nitride 13 are formed on the surface of the organic silicon oxide 14. Patterns may be formed by using only the silicon oxide 12 or the silicon nitride 13 as the insulating material, or patterns may be formed by other insulating materials.

Next, a surface layer part of the organic silicon oxide 14 is polished (for example, subjected to CMP) until the silicon oxide 12 and the silicon nitride 13 are exposed to flatten the surface configured by the surfaces of the silicon oxide 12 and the silicon nitride 13 and the surface of the organic silicon oxide 14 (FIG. 1(*c*)). According to the polishing agent of the present embodiment, since the polishing of the silicon oxide 12 and the silicon nitride 13 after the silicon oxide 12 and the silicon nitride 13 have been exposed is suppressed, the surface of the base substrate can be uniformly finished.

The polishing rates for the organic silicon oxide and the insulating material are preferably the following polishing rate, from the viewpoint of being suitable for the double patterning application. The polishing rate for the organic silicon oxide is preferably 20 nm/min or more and more preferably 30 nm/min or more, from the viewpoint of shortening the polishing time. The polishing rate for the organic silicon oxide is preferably 300 nm/min or less, more preferably 200 nm/min or less, and further preferably 100 nm/min or less, from the viewpoint that the progress of excessive polishing for the concave portion of the organic silicon oxide is suppressed to further improve the flatness, and the viewpoint that it is easy to adjust the polishing time. The polishing rate for the insulating material is preferably 10 nm/min or less and more preferably 5 nm/min or less, from the viewpoint that it is easy to adjust the polishing time. Note that, the double patterning is a patterning process in which a first pattern is formed by a first exposure and development, and then a second pattern is formed on a space portion and the like of the first pattern, by a second exposure and development.

The polishing rate ratio of the organic silicon oxide with respect to the insulating material is preferably 5 or more, more preferably 10 or more, and further preferably 30 or more, from the viewpoint that the progress of polishing for the insulating material is suppressed so that it is easy to uniformly finish the surface of the base substrate. The above-described polishing rate ratio is, for example, a polishing rate ratio when a blanket wafer having an organic silicon oxide formed on a substrate and a blanket wafer having an insulating material formed on a substrate are polished. Furthermore, the above-described polishing rate ratio can be evaluated, for example, by respectively polishing a blanket wafer having an organic silicon oxide smoothly formed on a substrate and a blanket wafer having an insulating material smoothly formed on a substrate with the same polishing cloth at the same number of revolutions and the same load.

EXAMPLES

Hereinafter, the present invention will be more specifically described by means of Examples; however, the present invention is not limited to these Examples.

<Preparation of Polishing Agent>

Example 1

0.01 parts by mass of a methyldiallylamine hydrochloride polymer (manufactured by NITTOBO MEDICAL CO., LTD., PAS-M-1, weight average molecular weight: 20000; tertiary allylamine-based polymer having the structural unit of Formula (II); hereinafter, referred to as "allylamine-based polymer 1") and 0.6 parts by mass of adipic acid (acid component) were put in a container. Further, X parts by mass of ultrapure water was poured, and then stirring was performed to dissolve each component. Next, 2.00 parts by mass of colloidal silica having an average particle diameter of 70 nm was added to obtain 100 parts by mass of a polishing agent. The surface of the abrasive grain was positively charged in the polishing agent. Note that, the amount of X parts by mass of the ultrapure water blended was calculated and adjusted so that the polishing agent became 100 parts by mass.

Example 2

A polishing agent was obtained in the same manner as in Example 1, except that 0.01 parts by mass of a diallyldimethylammonium chloride/acrylamide copolymer (manufactured by NITTOBO MEDICAL CO., LTD., PAS-J-41, weight average molecular weight: 10000; quaternary allylamine-based polymer having the structural unit of Formula (IV); hereinafter, referred to as "allylamine-based polymer 2") was used as the allylamine-based polymer instead of the allylamine-based polymer 1.

Example 3

A polishing agent was obtained in the same manner as in Example 1, except that 0.01 parts by mass of a methyldiallylamineamide sulfate polymer (manufactured by NITTOBO MEDICAL CO., LTD., PAS-22SA-40, weight average molecular weight: 15000; tertiary allylamine-based copolymer having the structural unit of Formula (II); hereinafter, referred to as "allylamine-based polymer 3") was used as the allylamine-based polymer instead of the allylamine-based polymer 1.

Example 4

A polishing agent was obtained in the same manner as in Example 1, except that 0.01 parts by mass of a diallyldimethylammonium chloride polymer (manufactured by NITTOBO MEDICAL CO., LTD., PAS-H-5L, weight average molecular weight: 30000; quaternary allylamine-based copolymer having the structural unit of Formula (IV); hereinafter, referred to as "allylamine-based polymer 4") was used as the allylamine-based polymer instead of the allylamine-based polymer 1.

Example 5

A polishing agent was obtained in the same manner as in Example 1, except that 0.02 parts by mass of the allylamine-based polymer 1 was used.

Example 6

A polishing agent was obtained in the same manner as in Example 1, except that 0.1 parts by mass of acetic acid was used as the acid component instead of adipic acid.

Example 7

A polishing agent was obtained in the same manner as in Example 1, except that 0.1 parts by mass of malic acid was used as the acid component instead of adipic acid.

Example 8

A polishing agent was obtained in the same manner as in Example 1, except that 0.1 parts by mass of 5-methyl-1H-benzotriazole was used as the metal corrosion inhibitor.

Comparative Example 1

A polishing agent was obtained in the same manner as in Example 1, except that the allylamine-based polymer was not used.

Comparative Example 2

A polishing agent was obtained in the same manner as in Example 1, except that the pH of the polishing agent was set to 7.8.

Comparative Example 3

A polishing agent was obtained in the same manner as in Example 1, except that 0.5 parts by mass of malic acid was used and the pH of the polishing agent was set to 2.5.

Comparative Example 4

A polishing agent was obtained in the same manner as in Example 1, except that 0.01 parts by mass of a dimethyl-amine-ammonia-epichlorohydrin condensate (manufactured by SENKA corporation, UNISENCE KHE100L) that is a primary allylamine-based polymer was used instead of the allylamine-based polymer 1.

<pH Measurement of Polishing Agent>

The pH of the polishing agent was evaluated under the following conditions. The results are shown in Table 1.

Measurement temperature: 25±5° C.

Measuring apparatus: trade name: Model (F-51) manufactured by HORIBA, Ltd.

Measurement method: calibrating the pH meter by three points using a pH standard solution (4.01) of a phthalate, a pH standard solution (pH: 6.86) of a neutral phosphate, and a pH standard solution (pH: 9.18) of a borate, as pH standard solutions; then putting an electrode of the pH meter in the polishing agent; and measuring the pH with the above-described measuring apparatus, at the time after 2 minutes or longer elapsed and the pH became stable.

<Evaluation of Polishing Characteristics>

As the base substrate to be polished, a base substrate obtained by forming an organic silicon oxide film (also referred to as a SiOC film), which has an amount of carbon as measured by X-ray photoelectron spectroscopy (XPS) of 89 atm % and a thickness of 100 nm, on a silicon substrate, a base substrate obtained by forming a silicon dioxide film (insulating material film) having a thickness of 1000 nm on a silicon substrate by a CVD method, and a base substrate obtained by forming a silicon nitride film (insulating material film; also referred to as a $Si_3N_4$ film) having a thickness of 200 nm on a silicon substrate by a CVD method were used. Each of the above-described base substrates cut into 2 cm square was fixed to a holder, to which an adsorption pad for mounting a base substrate is attached, of a polishing apparatus (manufactured by NANO FACTOR, FACT-200). The holder was placed on a platen to which a foamed polyurethane polishing cloth is attached such that the surface of a material to be polished containing SiOC faced downward. A weight was placed thereon so that the processing load reached 0.34 kgf/cm$^2$. While the polishing agent was added dropwise onto the platen at 15 mL/min, the number of revolutions of the platen was set to 90 min$^{-1}$, and the SiO film, the silicon dioxide film, and the $Si_3N_4$ film were polished for 60 seconds.

The polishing rate was calculated from the difference in film thicknesses obtained by measuring the film thicknesses before and after polishing. For the measurement of the film thickness, a film thickness measuring apparatus F40 (manufactured by Filmetrics Japan, Inc.) was used. Furthermore, the polishing rate ratio was calculated by dividing the polishing rate for the SiOC film by the polishing rate for the insulating material film. The results are shown in Table 1.

<Corrosion Evaluation of Co Film>

Assuming a case where the base substrate has a metal wiring of Co, corrosion evaluation with respect to the Co film was performed. A blanket substrate (a) having a cobalt layer having a thickness of 200 nm formed on a 12-inch silicon substrate by a PVD method was prepared. The above-described blanket substrate (a) was cut into 20-mm square chips to prepare evaluation chips (b).

Each of the above-described evaluation chips (b) was put in each beaker in which 50 g of each of the above-described polishing agents had been put, and each of the beakers were immersed in a thermostatic bath at 60° C. for 1 minute. The evaluation chips (b) after being immersed were extracted and sufficiently washed with pure water, and then moisture on the chips was dried by blowing a nitrogen gas. The resistance of the evaluation chips (b) after being dried was measured with a resistivity meter and converted into the film thickness of the cobalt layer after being immersed by Formula (1) below.

The calibration curve was obtained from information of resistance values each corresponding to each film thickness of the blanket substrate (a), and the film thickness of the cobalt layer was determined by Formula (1) below.

Film thickness [nm] of cobalt layer after being immersed=1291.9×(Resistance value [mΩ] of evaluation chip (*b*)^(−0.8658)/10 (1)

Then, the etching rate for the cobalt layer was determined by Formula (2) below from the obtained film thickness of the cobalt layer after being immersed and the thickness of the cobalt layer before being immersed.

Etching rate of cobalt layer (Co-ER) [nm/min]=(Film thickness [nm] of cobalt layer before being immersed−Film thickness [nm] of cobalt layer after being immersed)/1 minute (2)

TABLE 1

| | Composition | Example 1 | Example 2 | Example 3 | Example 4 | Example 5 | Example 6 | Example 7 | Example 8 | Comparative Example 1 | Comparative Example 2 | Comparative Example 3 | Comparative Example 4 |
|---|---|---|---|---|---|---|---|---|---|---|---|---|---|
| Abrasive grains | Colloidal silica | 2 | 2 | 2 | 2 | 2 | 2 | 2 | 2 | 2 | 2 | 2 | 2 |
| Polymer | Allylamine-based polymer 1 | 0.01 | — | — | — | 0.02 | 0.01 | 0.01 | 0.01 | — | 0.01 | 0.01 | — |
| | Allylamine-based polymer 2 | — | — | — | — | — | — | — | — | — | — | — | — |
| | Allylamine-based polymer 3 | — | — | 0.01 | — | — | — | — | — | — | — | — | — |
| | Allylamine-based polymer 4 | — | — | — | 0.01 | — | — | — | — | — | — | — | — |
| | Allylamine-based polymer 5 | — | — | — | — | — | — | — | — | — | — | — | 0.01 |
| Acid component | Adipic acid | 0.6 | 0.6 | 0.6 | 0.6 | 0.6 | — | — | 0.6 | 0.6 | — | — | 0.6 |
| | Acetic acid | — | — | — | — | — | 0.1 | — | — | — | — | — | — |
| | Malic acid | — | — | — | — | — | — | 0.1 | — | — | — | 0.5 | — |
| Corrosion inhibitor | 5-Methyl- H-benzotriazole | — | — | — | — | — | — | — | 0.1 | — | — | — | — |
| pH of polishing agent | | 3.1 | 3.1 | 3.1 | 3.1 | 3.1 | 3.7 | 3 | 3.1 | 3.1 | 7.8 | 2.5 | 3 |
| Evaluation | Polishing rate (nm/min) for SiOC film | 32 | 40 | 28 | 44 | 25 | 47 | 26 | 27 | 49 | 1 | 10 | 15 |
| | Polishing rate (nm/min) for $SiO_2$ film | 4 | 8 | 5 | 6 | 3 | 8 | 6 | 4 | 113 | 10 | 5.3 | 14 |
| | SiOC film/$SiO_2$ film polishing rate selection ratio | 8.0 | 5.0 | 5.6 | 7.3 | 8.3 | 5.9 | 4.3 | 6.8 | 0.4 | 0.1 | 1.9 | 1.1 |
| | Polishing rate (nm/min) for $Si_3N_4$ film | 1 | 2 | 2 | 1 | 1 | 2 | 2 | 1 | 11 | 5 | 1 | 2 |
| | SiOC film/$Si_3N_4$ film polishing rate selection ratio | 32.0 | 20.0 | 14.0 | 44.0 | 25.0 | 23.5 | 13.0 | 27.0 | 4.5 | 0.2 | 10.0 | 7.5 |
| | Dissolution rate (nm/min) of Co film | 6 | 6 | 6 | 6 | 6 | 6 | 11 | 1 | 6 | 1 | 12 | — |

REFERENCE SIGNS LIST

11: substrate, 12: silicon oxide, 13: silicon nitride, 14: organic silicon oxide.

The invention claimed is:

1. A polishing agent for polishing a base substrate having a silicon oxide containing carbon and an insulating material containing silicon (excluding the silicon oxide containing carbon) to remove at least a part of the silicon oxide containing carbon, the polishing agent comprising:

abrasive grains containing silica; and an allylamine-based polymer, wherein the abrasive grains have a positive charge in the polishing agent, the allylamine-based polymer has at least one selected from the group consisting of a structural unit represented by Formula (I) below, a structural unit represented by Formula (II) below, a structural unit represented by Formula (III) below, and a structural unit represented by Formula (V) below:

(I)

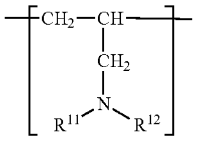

in the formula, $R^{11}$ and $R^{12}$ each independently represent an alkyl group or an aralkyl group, and an amino group may form an acid addition salt, (II)

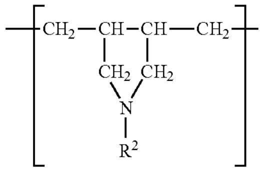

in the formula, $R^2$ represents an alkyl group or an aralkyl group, and a nitrogen-containing ring may form an acid addition salt, (III)

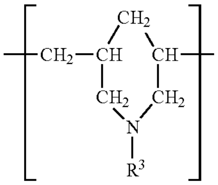

in the formula, $R^3$ represents an alkyl group or an aralkyl group, and a nitrogen-containing ring may form an acid addition salt, (V)

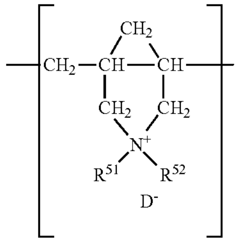

in the formula, $R^{51}$ and $R^{52}$ each independently represent an alkyl group or an aralkyl group, and $D^-$ represents a monovalent anion, a PH of the polishing agent is 2.8 to 4.2, and the polishing agent is configured to provide a polishing rate ratio SiOC film/$SiO_2$ film of a SiOC film with respect to a $SiO_2$ film of 4.3 or more or the polishing agent is configured to provide a polishing rate ratio SiOC film/$Si_3N_4$ film of a SiOC film with respect to a $Si_3N_4$ film of 13 or more.

2. The polishing agent according to claim 1, wherein the allylamine-based polymer has a structural unit represented by Formula (II) below:

(II)

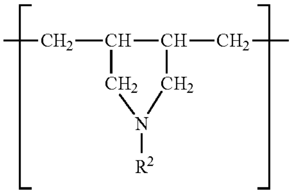

in the formula, $R^2$ represents an alkyl group or an aralkyl group, and a nitrogen-containing ring may form an acid addition salt.

3. The polishing agent according to claim 1, wherein the silica is colloidal silica.

4. The polishing agent according to claim 1, wherein the pH of the polishing agent is 3.0 to 4.0.

5. The polishing agent according to claim 1, wherein the polishing agent is stored as a multi-pack type polishing agent having:

a first liquid containing the abrasive grains; and a second liquid containing the allylamine-based polymer.

6. A stock solution for a polishing agent, the stock solution for obtaining the polishing agent according to claim 1 wherein the stock solution is diluted with water to obtain the polishing agent.

7. A polishing method comprising:

a step of preparing a base substrate having a silicon oxide containing carbon and an insulating material containing silicon (excluding the silicon oxide containing carbon);

a step of diluting the stock solution for a polishing agent according to claim 6 with water to obtain the polishing agent; and a polishing step of polishing the base substrate by using the polishing agent to remove at least part of the silicon oxide containing carbon.

8. A polishing method comprising:

a step of preparing a base substrate having a silicon oxide containing carbon and an insulating material containing silicon (excluding the silicon oxide containing carbon); and a polishing step of polishing the base substrate by using the polishing agent according to claim 1 to remove at least a part of the silicon oxide containing carbon.

9. The polishing agent according to claim 1, wherein the allylamine-based polymer contains a methyldiallylamine hydrochloride polymer.

10. The polishing agent according to claim 1, wherein the allylamine-based polymer contains a methyldiallylamine-amide sulfate polymer.

11. The polishing agent according to claim 1, wherein a content of the allylamine-based polymer is 0.001 to 0.4 parts by mass with respect to 100 parts by mass of the polishing agent.

12. The polishing agent according to claim 1, wherein a mass ratio of a content of the allylamine-based polymer with respect to a content of the abrasive grains is 0.002 to 0.4.

13. The polishing agent according to claim 1, wherein the polishing agent is configured to provide a polishing rate ratio SiOC film/$SiO_2$ film of a SiOC film with respect to a $SiO_2$ film of 4.3 or more.

14. The polishing agent according to claim 1, wherein the polishing agent is configured to provide a polishing rate ratio SiOC film/$Si_3N_4$ film of a SiOC film with respect to a $Si_3N_4$ film of 13 or more.

15. A polishing agent for polishing a base substrate having a silicon oxide containing carbon and an insulating material containing silicon (excluding the silicon oxide containing carbon) to remove at least a part of the silicon oxide containing carbon, the polishing agent comprising:

abrasive grains containing silica; and an allylamine-based polymer, wherein the abrasive grains have a positive charge in the polishing agent, the allylamine-based polymer has a structural unit represented by Formula (IV) below:

(IV)

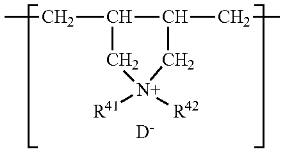

in the formula, $R^{41}$ and $R^{42}$ each independently represent an alkyl group or an aralkyl group, and $D^-$ represents a monovalent anion, the allylamine-based polymer further has a structural unit represented by Formula (IX) below;

(IX)

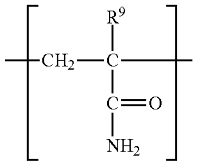

in the formula, $R^9$ represents a hydrogen atom or an alkyl group, a pH of the polishing agent is 2.8 to 4.2, and the polishing agent is configured to provide a polishing rate ratio SiOC film/$SiO_2$ film of a SiOC film with respect to a $SiO_2$ film of 4.3 or more or the polishing agent is configured to provide a polishing rate ratio SiOC film/$Si_3N_4$ film of a SiOC film with respect to a $Si_3N_4$ film of 13 or more.

16. The polishing agent according to claim 15, wherein the allylamine-based polymer contains a diallyldimethylammonium chloride/acrylamide copolymer.

17. The polishing agent according to claim 15, wherein the polishing agent is configured to provide a polishing rate ratio SiOC film/$SiO_2$ film of a SiOC film with respect to a $SiO_2$ film of 4.3 or more.

18. The polishing agent according to claim 15, wherein the polishing agent is configured to provide a polishing rate ratio SiOC film/$Si_3N_4$ film of the SiOC film with respect to the $Si_3N_4$ film of 13 or more.

19. A polishing agent for polishing a base substrate having a silicon oxide containing carbon and an insulating material containing silicon (excluding the silicon oxide containing carbon) to remove at least a part of the silicon oxide containing carbon, the polishing agent comprising:

abrasive grains containing silica; and an allylamine-based polymer, wherein the abrasive grains have a positive charge in the polishing agent, the allylamine-based polymer is composed of a structural unit represented by Formula (IV) below:

(IV)

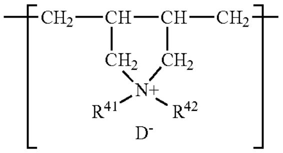

in the formula, $R^{41}$ and $R^{42}$ each independently represent an alkyl group or an aralkyl group, and $D^-$ represents a monovalent anion, a content of the allylamine-based polymer is 0.003 parts by mass or more with respect to 100 parts by mass of the polishing agent, a pH of the polishing agent is 2.8 to 4.2, and the polishing agent is configured to provide a polishing rate ratio SiOC film/$SiO_2$ film of a SiOC film with respect to a $SiO_2$ film of 4.3 or more or the polishing agent is configured to provide a polishing rate ratio SiOC film/$Si_3N_4$ film of a SiOC film with respect to a $Si_3N_4$ film of 13 or more.

20. The polishing agent according to claim 19, wherein the allylamine-based polymer contains a diallyldimethylammonium chloride polymer.

21. The polishing agent according to claim 19, wherein the polishing agent is configured to provide a polishing rate ratio SiOC film/SiO2 film of a SiOC film with respect to a $SiO_2$ film of 4.3 or more.

22. The polishing agent according to claim 19, wherein the polishing agent is configured to provide a polishing rate ratio SiOC film/$Si_3N_4$ film of a SiOC film with respect to a $Si_3N_4$ film of 13 or more.

* * * * *